(12) United States Patent
Farian et al.

(10) Patent No.: US 11,169,182 B2
(45) Date of Patent: Nov. 9, 2021

(54) VOLTAGE DIVIDERS

(71) Applicant: Nordic Semiconductor ASA, Trondheim (NO)

(72) Inventors: Lukasz Farian, Trondheim (NO); Ola Bruset, Trondheim (NO); Werner Luzi, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 215 days.

(21) Appl. No.: 16/472,582

(22) PCT Filed: Dec. 20, 2017

(86) PCT No.: PCT/GB2017/053839
§ 371 (c)(1),
(2) Date: Jun. 21, 2019

(87) PCT Pub. No.: WO2018/115870
PCT Pub. Date: Jun. 28, 2018

(65) Prior Publication Data
US 2020/0088767 A1 Mar. 19, 2020

(30) Foreign Application Priority Data
Dec. 22, 2016 (GB) .................. 1622040

(51) Int. Cl.
*G01R 15/06* (2006.01)
*G01R 19/00* (2006.01)
(Continued)

(52) U.S. Cl.
CPC ........ *G01R 15/06* (2013.01); *G01R 19/0023* (2013.01); *G05F 1/56* (2013.01); *H02M 3/06* (2013.01)

(58) Field of Classification Search
CPC ........ G01R 15/00; G01R 15/04; G01R 15/06; G01R 19/00; G01R 19/0023; G05F 1/00;
(Continued)

(56) References Cited

U.S. PATENT DOCUMENTS 6,259,612 B1 * 7/2001 Itoh .................. H02M 3/07
363/60
7,263,054 B2 8/2007 Liu
(Continued)

FOREIGN PATENT DOCUMENTS

| CN | 204030954 U | 12/2014 |
| WO | WO 2010/068682 A2 | 6/2010 |
| WO | WO 2011/090687 A2 | 7/2011 |

OTHER PUBLICATIONS

International Search Report and Written Opinion for PCT/GB2017/053839, dated Mar. 2, 2018, 14 pages.
(Continued)

*Primary Examiner* — Hoai-An D. Nguyen
(74) *Attorney, Agent, or Firm* — Klarquist Sparkman, LLP

(57) ABSTRACT

A voltage divider circuit arrangement includes a resistive divider circuit portion constructed from first and second resistors (R1, R2) The first and second resistors are connected in series and are arranged to provide a refresh voltage (Vrefresh) at a refresh node between them. A capacitive divider circuit portion is constructed from first and second capacitors (C1, C2). The first and second capacitors are connected in series and are arranged to provide an output voltage (Vout) at an output node. A switching circuit portion is arranged intermittently to switch the voltage divider circuit arrangement between a first mode wherein the resistive divider is enabled and the output node is connected to the refresh node, and a second mode wherein the resistive (Continued)

divider is disabled and the output node is not connected to the refresh node.

16 Claims, 4 Drawing Sheets

(51) Int. Cl.
*G05F 1/56* (2006.01)
*H02M 3/06* (2006.01)

(58) Field of Classification Search
CPC .... G05F 1/10; G05F 1/46; G05F 1/56; H02M 3/00; H02M 3/02; H02M 3/04; H02M 3/06; H02M 2003/072
USPC ......... 324/76.11, 76.12, 76.13, 98, 416, 522, 324/713; 327/538, 540; 340/13.38, 500, 340/501, 506, 510; 702/1, 57, 64
See application file for complete search history.

(56) References Cited

U.S. PATENT DOCUMENTS

| 7,619,482 | B1 | 11/2009 | Kwong | |
|---|---|---|---|---|
| 7,928,787 | B2* | 4/2011 | Mehas | H02M 3/1588 327/205 |
| 8,222,881 | B2* | 7/2012 | Ivanov | G05F 1/56 323/288 |
| 2013/0082684 | A1* | 4/2013 | Spalding, Jr. | G01R 15/06 324/111 |
| 2013/0113507 | A1* | 5/2013 | Danesh | G01R 21/14 324/713 |
| 2015/0054480 | A1 | 2/2015 | Meher et al. | |
| 2016/0054358 | A1* | 2/2016 | Beyerlein | G01R 19/0084 324/126 |

OTHER PUBLICATIONS

Search Report under Section 17(5) for GB1622040.2, dated Jul. 5, 2017, 3 pages.

* cited by examiner

VOLTAGE DIVIDERS

CROSS REFERENCE TO RELATED APPLICATIONS

This is the U.S. National Stage of International Application No. PCT/GB2017/053839 filed Dec. 20, 2017, which was published in English under PCT Article 21(2), which in turn claims the benefit of Great Britain Application No. 1622040.2, filed Dec. 22, 2016.

The present invention relates to voltage divider circuits, particularly to voltage divider circuits having low power consumption requirements suitable for use in battery powered devices.

It is a common aim in electronic circuits to produce a lower output voltage from a higher input voltage, wherein the output voltage is a fixed proportion of the input voltage. This is useful for example when it is desirable to produce a reference voltage. A common circuit arrangement used to achieve this is a voltage divider, sometimes referred to in the art as a potential divider. A voltage divider is a relatively simple passive linear circuit that divides a voltage connected across the divider due to the electrical properties of the components that the divider is constructed from.

In general, a voltage divider may be constructed from two electrical impedances $Z_1$, $Z_2$ connected in series with one another, with the input voltage $V_{in}$ connected across the series combination of $Z_1$ and $Z_2$. The output voltage $V_{out}$ is then taken from a node between $Z_1$ and $Z_2$. As is well understood by those skilled in the art, the output voltage will be proportional to the ratio of the impedances in accordance with Equation 1 below.

Characteristic equation of a voltage divider     Equation 1

$$V_{out} = \frac{Z_2}{Z_1 + Z_2} \cdot V_{in}$$

Typically the electrical impedances used to construct such a voltage divider are simply the resistance values of two fixed resistors connected in series, however it will also be appreciated by those skilled in the art that inductors and capacitors also present electrical impedance characteristics. Resistors are usually the conventional choice of component when constructing a voltage divider that is to be used in direct current (DC) applications. Capacitors may be used instead, however these are suitable only for alternating current (AC) applications.

The Applicant has appreciated that resistive voltage dividers are not well suited to ultra-low-power applications such as battery-powered system-on-chip (SoC) devices due to size constraints. In order to keep the current consumption of the voltage divider low, the resistance of the fixed resistors would have to be in the order of a few megaohms or greater, however resistors with such large resistances typically require a lot of physical space on the circuit which increases cost.

When viewed from a first aspect, the present invention provides a voltage divider circuit arrangement comprising:
a resistive divider circuit portion comprising at least first and second resistors having first and second resistor impedance values respectively, wherein said first and second resistors are connected in series and are arranged to provide a refresh voltage at a refresh node therebetween;
a capacitive divider circuit portion comprising at least first and second capacitors having first and second capacitor impedance values respectively, wherein said first and second capacitors are connected in series and are arranged to provide an output voltage at an output node therebetween; and
a switching circuit portion arranged intermittently to switch the voltage divider circuit arrangement between a first mode wherein the resistive divider circuit portion is enabled and the output node is connected to the refresh node, and a second mode wherein the resistive divider circuit portion is disabled and the output node is not connected to the refresh node.

Thus it will be appreciated by those skilled in the art that the present invention provides an improved voltage divider circuit arrangement comprising both resistive and capacitive voltage dividers, wherein the resistive divider is used occasionally to refresh or update a voltage stored at the output node of the capacitive divider. Any further circuitry that requires the voltage produced by the voltage divider may then rely on the voltage at the output node of the capacitive divider rather than the resistive divider. This advantageously reduces the average current consumption of the device, as the capacitor-based divider will have very little (and ideally no) current flowing therethrough during operation.

In a set of embodiments a ratio between the first and second resistor impedance values is substantially equal to a ratio between the first and second capacitor impedance values and an input voltage connected across the resistive divider circuit portion is the same as an input voltage is connected across the capacitive divider circuit portion. In accordance with such embodiments, the impedance ratio of the capacitive divider being substantially equal to the impedance ratio of the resistive divider causes the output voltage at the output node produced by the capacitive voltage divider to "track" or "follow" any changes in the input voltage in the same way that the resistive divider would. By way of non-limiting example, if the resistance values of the first and second resistors are equal, the voltage at the refresh node will be half the input voltage at all times that the resistive circuit portion is enabled. By the respective ratios being "substantially equal" and the input voltages being "the same" it should therefore be understood that the voltage at the refresh node and the output node should be as close to one another as necessary to achieve design specification for the rest of the circuit. For example it will be subject to component tolerances. Absolute identity is therefore not essential.

In a set of embodiments the voltage divider circuit arrangement further comprises a hysteresis circuit portion arranged to vary the refresh voltage and the output voltage between a first value and a second value. This may be suitable if the output voltage produced at the output node is to be used as an input to further circuitry that utilises hysteresis. In some such embodiments, the hysteresis circuit portion comprises a hysteresis resistor and a hysteresis capacitor, wherein said the hysteresis circuit portion is arranged selectively to connect said hysteresis resistor in series with at least one of the first and second resistors and to connect said hysteresis capacitor in parallel with at least one of the first and second capacitors.

In a set of such embodiments, the hysteresis circuit portion further comprises a first hysteresis transistor connected in parallel with the hysteresis resistor and a second hysteresis transistor connected in series with the hysteresis capacitor, wherein a first hysteresis signal is applied to the gate terminal of the first hysteresis transistor and a second hysteresis signal is applied to the gate terminal of the second hysteresis transistor.

In some arrangements, the first hysteresis transistor comprises a p-channel metal-oxide-semiconductor field-effect-transistor (pMOSFET) and the second hysteresis transistor comprises an n-channel metal-oxide-semiconductor field-effect-transistor (nMOSFET) and in such arrangements, the first hysteresis signal and the second hysteresis signal may be the same such that if the first hysteresis signal is logic high, the second hysteresis signal is also logic high.

It will of course be appreciated that the arrangement described above is only one example and the Applicant has envisaged alternative arrangements. For example, both the first and second hysteresis transistors may be the same type of transistor (e.g. both of the first and second hysteresis transistors are a pMOSFET or both are an nMOSFET), wherein the first hysteresis signal is the logical negation of the second hysteresis signal, such that if the first hysteresis signal is logic high, the second hysteresis signal is logic low and vice versa. This is however less preferred, as additional balancing of the impedance ratios would be required.

In preferred embodiments, there is a predetermined delay between the resistive divider circuit portion being enabled and the output node being connected to the refresh node when the switching circuit portion switches to the first mode. For example a delay circuit may be provided. This may advantageously prevent the output of the resistive divider 'pulling down' the output of the capacitive divider if connected before the resistive divider has settled. In a set of potentially overlapping embodiments, there is a predetermined delay between the output node being disconnected from the refresh node and the resistive divider circuit portion being disabled when the switching circuit portion switches to the second mode. This may prevent the output node being pulled down if voltage at the refresh node begins to decay before the connection to the output node has been switched off.

In a set of embodiments, the intermittent switching is controlled by a mode switch signal. In some such embodiments, the mode switch signal comprises a series of pulses. In some such embodiments, the switching circuit portion comprises a first switching transistor connected in series with the resistive divider circuit portion. The gate terminal of the first switching transistor may be connected to receive the mode switch signal. In a set of potentially overlapping embodiments, the switching circuit portion comprises a second switching transistor connected between the refresh node and the output node. The gate terminal of the second switching transistor may be connected to receive the mode switch signal. It will of course be appreciated that, depending on the choice of type of switching transistors (e.g. nMOSFETs or pMOSFETs), the signal applied to the gate terminal of each of these may be a signal derived from the mode switch signal rather than the mode switch signal itself, for example a logical negation of the mode switch signal. For example, in some arrangements, the first switching transistor may comprise a pMOSFET while the second switching transistor may comprise an nMOSFET and in such arrangements, the first switching transistor may receive at its gate terminal a logical negation of the mode switch signal while the second switching transistor may receive at its respective gate terminal the mode switch signal itself.

While the intermittent switching may be arranged to take place on an ad hoc basis, e.g. as determined to be necessary or dependent on a signal generated elsewhere, in preferred embodiments, the intermittent switching between the first mode and the second mode is periodic. In a set of such embodiments, the switching circuit portion comprises an oscillator circuit portion arranged to produce a reference signal at a reference frequency and a one shot circuit portion arranged to produce the switch mode signal from the reference signal. In such embodiments, the oscillator circuit portion and the one shot circuit portion may form a monostable multivibrator. The oscillator circuit may be arranged to produce the reference signal with a fixed (or variable) frequency, which is input to the one shot circuit that generates a low duty mode switch signal.

In a set of embodiments the voltage divider circuit arrangement is used in a feedback path of a voltage regulator, e.g. a low-dropout voltage regulator. The Applicant has appreciated that the voltage divider circuit arrangement described hereinabove is particularly advantageous in this context. When viewed from a second aspect, the present invention provides a voltage regulating circuit arrangement comprising:

an error amplifier arranged to compare a reference voltage to a feedback voltage and produce at its output an error voltage proportional to a difference between said reference and feedback voltages;

a pass field-effect-transistor arranged such that a source terminal thereof is connected to an input voltage, a gate terminal thereof connected to the output of the error amplifier, and a drain terminal thereof is connected to a load capacitor, wherein a regulator output voltage is produced at a node between the drain terminal of the pass field-effect-transistor and the load capacitor; and a voltage divider circuit arrangement comprising:

a resistive divider circuit portion comprising at least first and second resistors having first and second resistor impedance values respectively, wherein said first and second resistors are connected in series and are arranged to provide a refresh voltage at a refresh node therebetween;

a capacitive divider circuit portion comprising at least first and second capacitors having first and second capacitor impedance values respectively, wherein said first and second capacitors are connected in series and are arranged to provide the feedback voltage at an output node therebetween; and a switching circuit portion arranged intermittently to switch the voltage divider circuit arrangement between a first mode wherein the resistive divider circuit portion is enabled and the output node is connected to the refresh node, and a second mode wherein the resistive divider circuit portion is disabled and the output node is not connected to the refresh node.

It will be appreciated that the optional and preferred features described hereinabove with reference to the first aspect of the invention also equally apply to the second aspect of the invention.

Certain embodiments of the present invention will now be described with reference to the accompanying drawings, in which.

Figure 1:
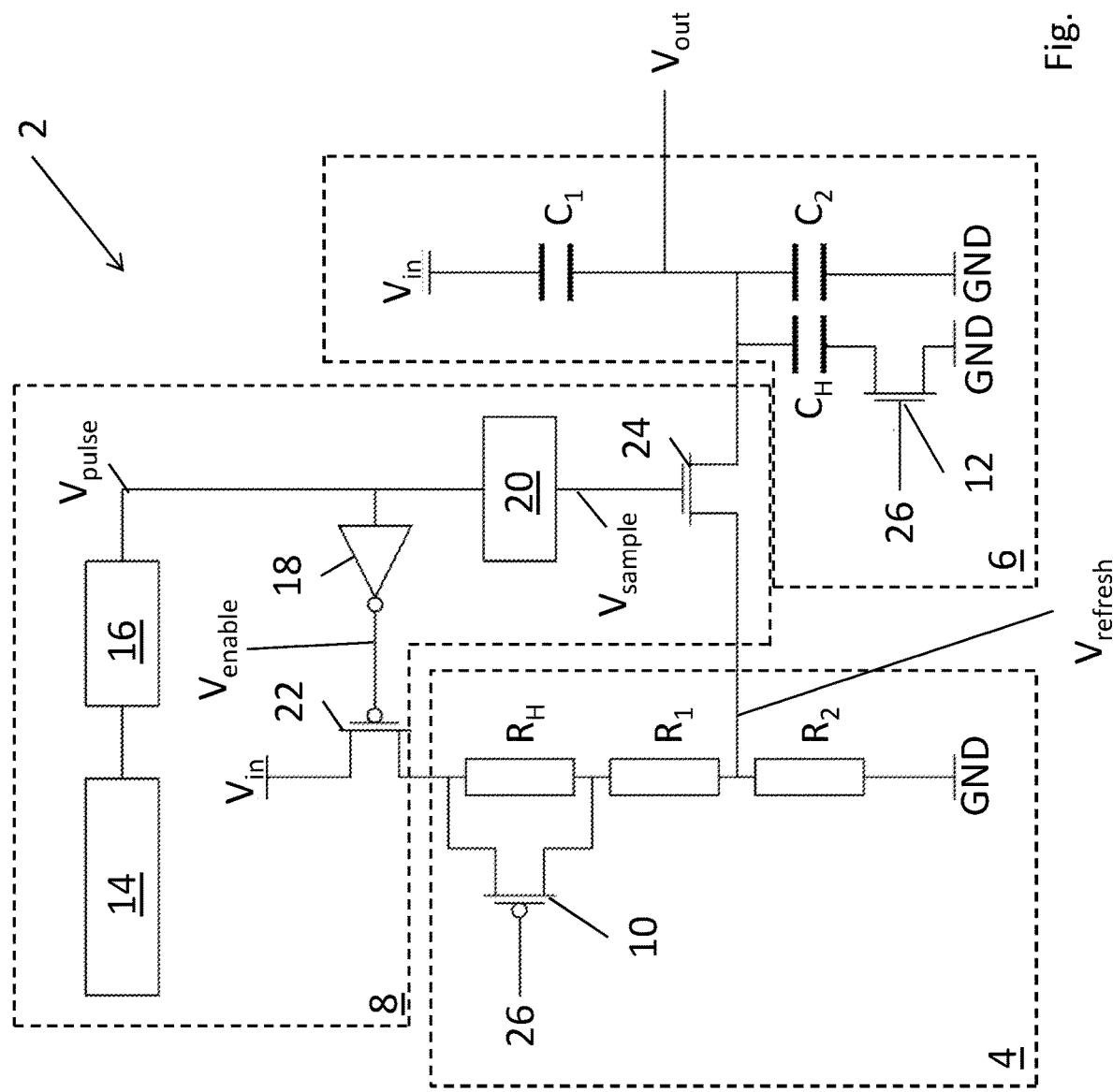
FIG. 1 is a circuit diagram of a voltage divider circuit arrangement in accordance with an embodiment of the present invention.

FIG. 1 is a circuit diagram of a voltage divider circuit arrangement 2 in accordance with an embodiment of the present invention. The voltage divider circuit arrangement 2 is arranged to receive an input voltage $V_{in}$ and produce a lower output voltage $V_{out}$. The voltage divider circuit arrangement 2 shown in FIG. 1 is divided into three logical circuit portions: a resistive divider circuit portion 4; a capacitive divider circuit portion 6; and a switching circuit portion 8. The construction and function of each of the circuit portions 4, 6, 8 will be described in further detail below. It will of course be appreciated that these logical divisions are for illustrative purposes only and will typically all form part of a single integrated circuit.

The resistive divider circuit portion 4 comprises: a first resistor $R_1$; a second resistor $R_2$; a hysteresis resistor $R_H$; and a hysteresis p-channel metal-oxide-semiconductor field-effect-transistor (pMOSFET) 10.

The capacitive divider circuit portion 6 comprises: a first capacitor $C_1$; a second capacitor $C_2$; a hysteresis capacitor $C_H$; and an n-channel metal-oxide-semiconductor field-effect-transistor (nMOSFET) 12.

The switching circuit portion 8 comprises: a low frequency oscillator 14; a monostable multivibrator circuit or "one-shot" pulse generator 16; a Boolean inverter 18; a delay circuit 20; a first switching pMOSFET 22; and a second switching nMOSFET 24.

The resistive divider circuit portion 4 is arranged such that the resistors $R_1$, $R_2$, $R_H$ are connected in series with one another and with the first switching pMOSFET 22 such that the input voltage $V_{in}$ is connected to the source terminal of the first switching pMOSFET 22, the drain terminal of the first switching pMOSFET 22 is connected to one terminal of the hysteresis resistor $R_H$, the other terminal of the hysteresis resistor $R_H$ is connected to a first terminal of the first resistor $R_1$, the second terminal of the first resistor $R_1$ is connected to a first terminal of the second resistor $R_2$, and the second terminal of the second resistor R2 is connected to ground GND. The first hysteresis pMOSFET 10 is connected in parallel with the hysteresis resistor $R_H$ such that its source terminal is connected to a first terminal of the hysteresis resistor $R_H$ and its drain terminal is connected to the other terminal of the hysteresis resistor $R_H$. The gate terminal of the hysteresis pMOSFET 10 is arranged to receive a hysteresis signal 26 as will be described in further detail below. A "refresh node" 28 connected between the first resistor $R_1$ and the second resistor $R_2$ is connected to the drain terminal of the second switching nMOSFET 24.

The capacitive divider circuit portion 6 is arranged such that the first capacitor $C_1$ and the second capacitor $C_2$ are connected in series such that one terminal of the first capacitor $C_1$ is connected to the input voltage $V_{in}$, the other terminal of the first capacitor $C_1$ is connected to a first terminal of the second capacitor $C_2$, and the other terminal of the second capacitor $C_2$ is connected to ground GND. An output node 30 is connected between the first capacitor $C_1$ and the second capacitor $C_2$ and is further connected to the source terminal of the second switching nMOSFET 24. The hysteresis capacitor $C_H$ is connected in parallel with the second capacitor C2 such that a first terminal of the hysteresis capacitor $C_H$ is connected to the output node 30, and the other terminal of the hysteresis capacitor $C_H$ is connected to the drain terminal of the second hysteresis nMOSFET 12. The source terminal of the second hysteresis nMOSFET is connected to ground GND and the gate terminal of the second hysteresis nMOSFET 12 is arranged to receive the hysteresis signal 26.

The switching circuit portion 8 is arranged such that the oscillator 14 produces a reference clock signal having a particular frequency, e.g. 2 kHz, which is input to the one-shot pulse generator 16. The one-shot pulse generator 16 produces a series of relatively short pulses at the frequency set by the oscillator 14. This pulse signal is input to the inverter 18 and the delay circuit 20. The inverter 18 performs a Boolean NOT operation on the pulse signal and applies the inverted pulse signal to the gate terminal of a first switching pMOSFET 22. The non-inverted pulse signal is applied to the gate terminal of the second switching nMOSFET 24 after a predetermined delay as set by the delay circuit 20.

Each time the one-shot pulse generator 16 produces a pulse (i.e. at the frequency set by the oscillator 14), the first switching pMOSFET 22 is forced to conduct for a brief period of time thus enabling the resistive divider circuit portion 4. Assuming that the hysteresis signal 26 is logic low such that the hysteresis pMOSFET 10 is enabled, this allows current to flow from $V_{in}$ through the first switching pMOSFET 22, the first hysteresis pMOSFET 10, the first resistor $R_1$, and the second resistor $R_2$ to ground. As such, the voltage at the refresh node 28 will be $$\frac{R_2}{R_1 + R_2} \cdot V_{in}.$$

After the duration set by the delay circuit 20 to enable the resistive divider circuit portion to settle, the second switching nMOSFET 24 is also made to conduct. This allows the voltage at the refresh node 28 to be "copied" to the output node 30 within the capacitive divider circuit portion 6. After the pulse has ended, the switching transistors 22, 24 are disabled, thus disconnecting the output node 30 from the refresh node 28 before disabling the resistive divider circuit portion 4. Disconnecting the output node 30 from the refresh node 28 before disabling the resistive divider circuit portion 4 prevents the output node 30 being pulled down when the output of the resistive divider circuit portion 4 falls after being disabled. The output voltage $V_{out}$ is then provided solely by the capacitive divider circuit portion 6 until the next pulse generated by the one-shot pulse generator 16.

Providing the ratio between the impedance of the first resistor $R_1$ and the impedance of the second resistor $R_2$ is substantially equal to the ratio between the impedance of the first capacitor $C_1$ and the second capacitor $C_2$, the output voltage $V_{out}$, will be the same proportion of the input voltage $V_{in}$ as would be the case if the resistive divider circuit portion 4 was used alone. Moreover the output voltage $V_{out}$ can track changes in the input voltage $V_{in}$. However, due to the fact that capacitors "block" DC currents, only a negligible amount of current flows through the capacitive divider circuit portion 6 (due to leakage associated with non-ideal capacitors) when compared to the current required by the resistive divider circuit portion 4.

Figure 2:
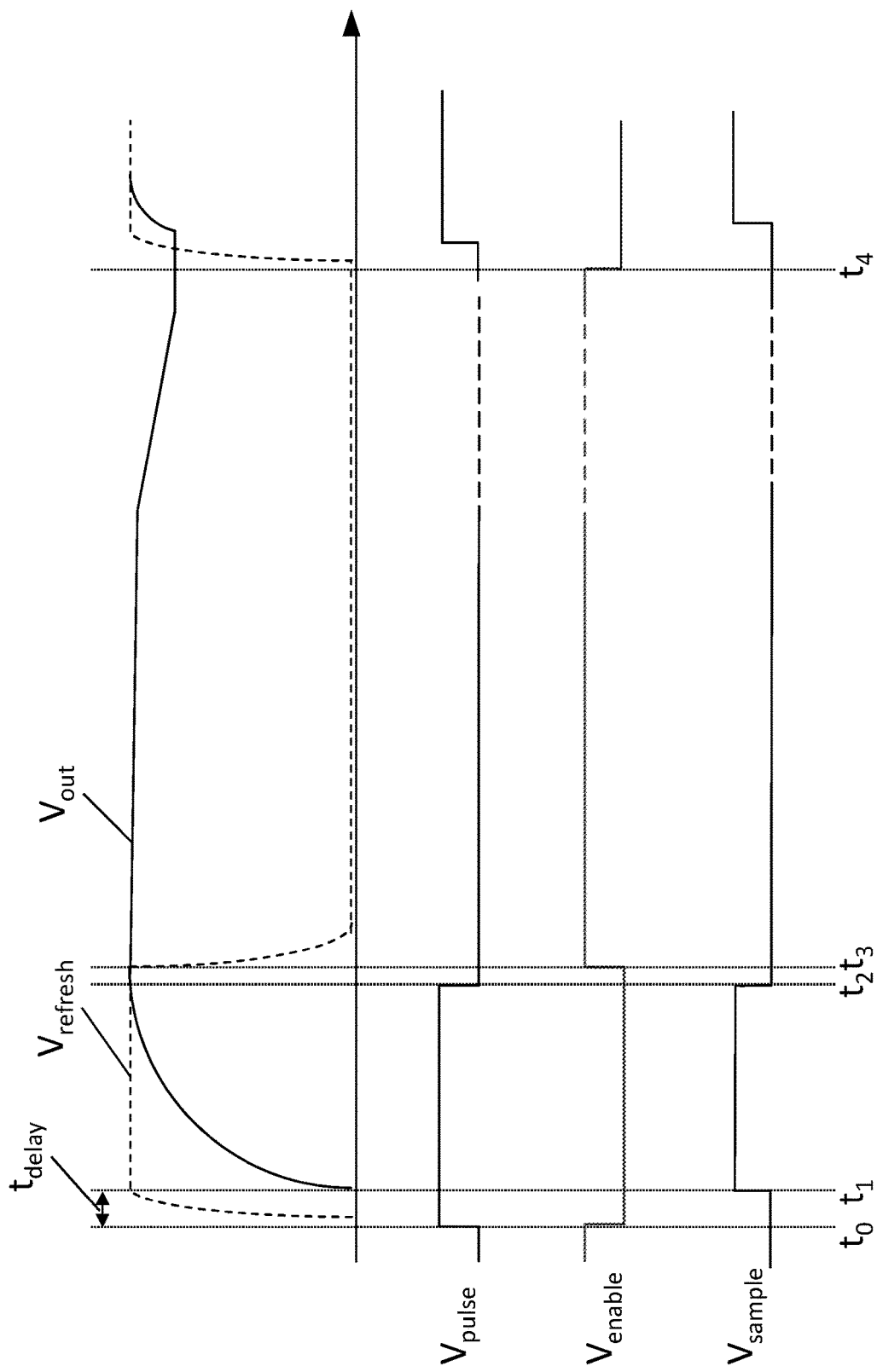
FIG. 2 is a graph showing the output voltage produced by the divider circuit of FIG. 1 during operation.

FIG. 2 is a graph showing the output voltage $V_{out}$ provided by the divider circuit arrangement 2 of FIG. 1 during operation. At a first time $t_0$, the voltage $V_{pulse}$ produced by the one-shot pulse generator 16 undergoes a rising edge such that it transitions from logic low to logic high. Due to the inverter 18, the voltage $V_{enable}$ applied to the gate terminal of the first switching pMOSFET 22 undergoes a falling edge such that it transitions from logic high to logic low.

This enables the resistive divider circuit portion 4 and the voltage $V_{refresh}$ at the refresh node 28 undergoes a rising edge and thus transitions from 0 V to the value determined by the ratio of the resistances of $R_1$ and $R_2$. After a short delay $t_{delay}$ set by the delay circuit 20, the voltage $V_{sample}$ applied to the gate terminal of the second switching nMOSFET 24 undergoes a rising edge such that it transitions from logic low to logic high at $t_1$. This causes the output voltage $V_{out}$ to begin rising to the value of $V_{refresh}$ while the capacitors $C_1$, $C_2$ (and optionally $C_H$) are charged.

At a subsequent time $t_2$, the pulse ends and thus $V_{pulse}$ drops to logic low. This causes $V_{sample}$ to return to its former logic low value and, shortly thereafter, $V_{enable}$ to return to its former logic high value at $t_3$. This disconnects the output node 30 from the refresh node 28 at $t_2$ and subsequently disables the resistive divider circuit portion 4 at $t_3$. After this occurs, the output voltage $V_{out}$ is provided only by the capacitive divider circuit portion 6 until the next time that $V_{pulse}$ undergoes a rising edge at $t_4$.

While in this particular embodiment the output node 30 is connected to the intermittently operated resistive divider circuit portion 4 periodically, arrangements are envisaged in which the output voltage $V_{out}$ is compared to a reference value and a pulse is applied to refresh the output voltage $V_{out}$ only if it has dropped by more than a threshold amount.

The hysteresis signal 26 may be applied such that the hysteresis resistor $R_H$ and the hysteresis capacitor $C_H$ are effectively added to or removed from the voltage divider circuit arrangement 2. Providing the values of these are chosen correctly, the impedance ratios associated with the resistive divider circuit portion 4 and the capacitive divider circuit portion 6 may be varied between two distinct values. Specifically, if the hysteresis signal 26 is logic low, the value of the refresh voltage $V_{refresh}$ will be $$\frac{R_2}{R_1 + R_2} \cdot V_{in}$$

as described previously, however if the hysteresis signal 26 is logic high, the value of the refresh voltage $V_{refresh}$ will be $$\frac{R_2}{R_1 + R_2 + R_H} \cdot V_{in}.$$

Similarly, if the hysteresis signal 26 is logic low, the value of the output voltage $V_{out}$ will be $$\frac{C_1}{C_1 + C_2} \cdot V_{in}$$

as described previously, however if the hysteresis signal 26 is logic high, the value of the output voltage $V_{out}$ will be $$\frac{C_1}{C_1 + C_2 + C_H} \cdot V_{in}.$$

If the output voltage $V_{out}$ is used as an input to a comparator (not shown), it may be advantageous to vary the output voltage $V_{out}$ between two different values.

As mentioned before, because the impedance ratio associated with the capacitive divider circuit portion 6 is the same as the impedance ratio associated with the resistive divider circuit portion 4, the output voltage $V_{out}$ will "track" any changes in the input voltage $V_{in}$ in the same manner that the resistive divider circuit portion 4 would.

Figure 3:
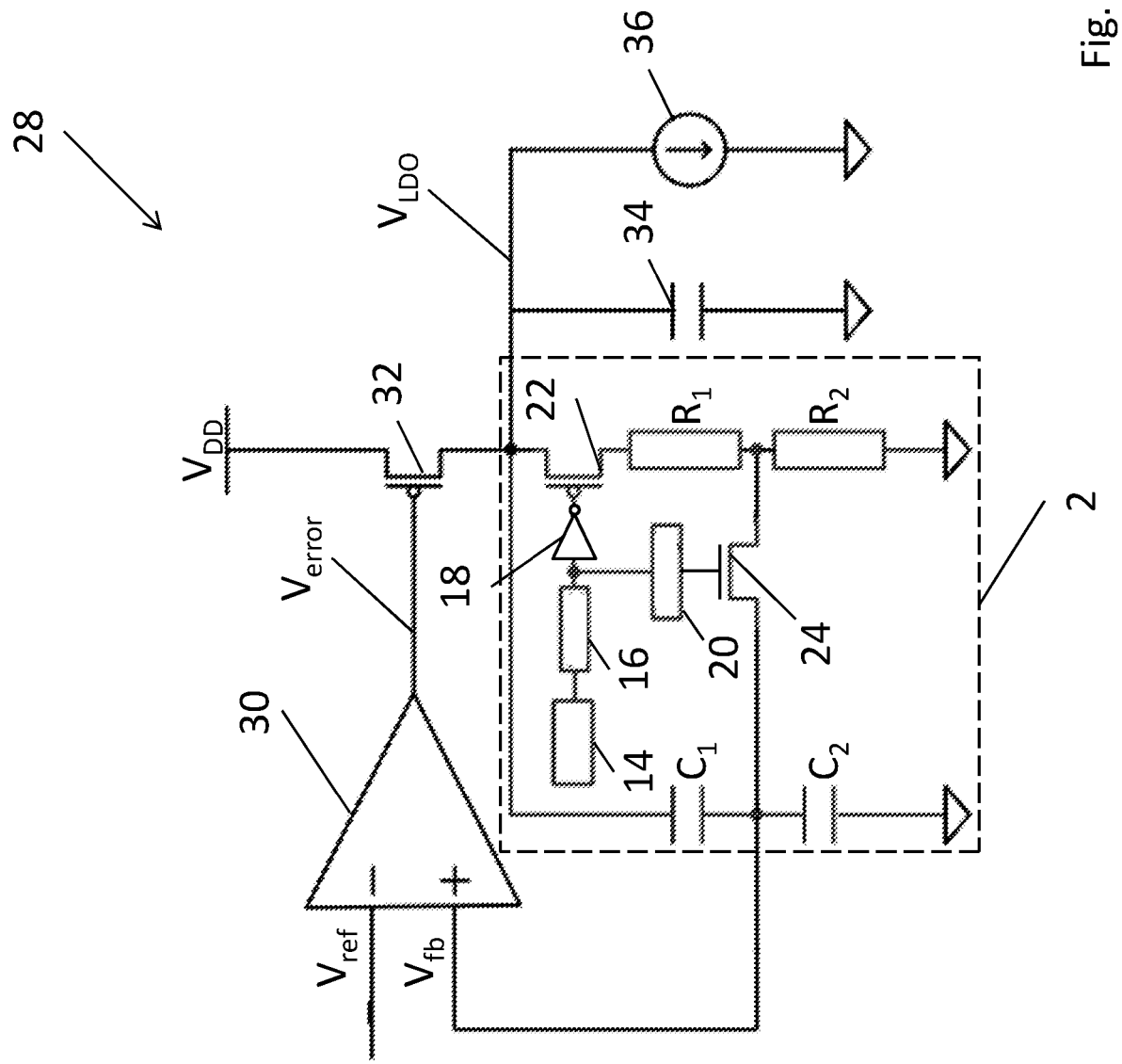
FIG. 3 is a circuit diagram of a low-dropout voltage regulator that includes the voltage divider circuit arrangement of FIG. 1 in accordance with a further embodiment of the present invention.

FIG. 3 is a circuit diagram of a low-dropout (LDO) voltage regulator 28 that includes the voltage divider circuit arrangement 2 of FIG. 1 in accordance with a further embodiment of the present invention. The LDO 28 comprises: an error amplifier 30; a pass p-channel metal-oxide-semiconductor field-effect-transistor or "pass-FET" 32; and a load including a load capacitor 34 and a load current 36.

The error amplifier 30 is an operational amplifier or "op-amp" that is arranged such that its inverting input is connected to a reference voltage $V_{ref}$ and its non-inverting input is connected to the output of the voltage divider circuit arrangement 2, referred to in FIG. 3 as a feedback voltage Vfb (i.e. the voltage labelled as the output voltage $V_{out}$ in FIG. 1). The error amplifier 30 compares the feedback voltage $V_{fb}$ to the reference voltage $V_{ref}$ and produces an error voltage $V_{error}$ that is dependent on the difference between them that is applied to the gate terminal of the pass-FET 32. The error amplifier 30 adjusts the gate-source voltage of the pass-FET 32 in response to the difference between the feedback voltage $V_{fb}$ and the reference voltage $V_{ref}$ so as to "top up" the output voltage $V_{LDO}$ across the load (i.e. across the load capacitor 34) in the manner of a conventional LDO regulator.

The feedback voltage $V_{fb}$ is derived from the output voltage $V_{LDO}$ produced by the LDO 28 using the voltage divider circuit 2 which is arranged in the feedback path of the error amplifier 30. In other words, the output voltage $V_{LDO}$ produced by the LDO 28 is effectively the input voltage $V_{in}$ provided to the voltage divider 2 as described previously with reference to FIG. 1.

Figure 4:
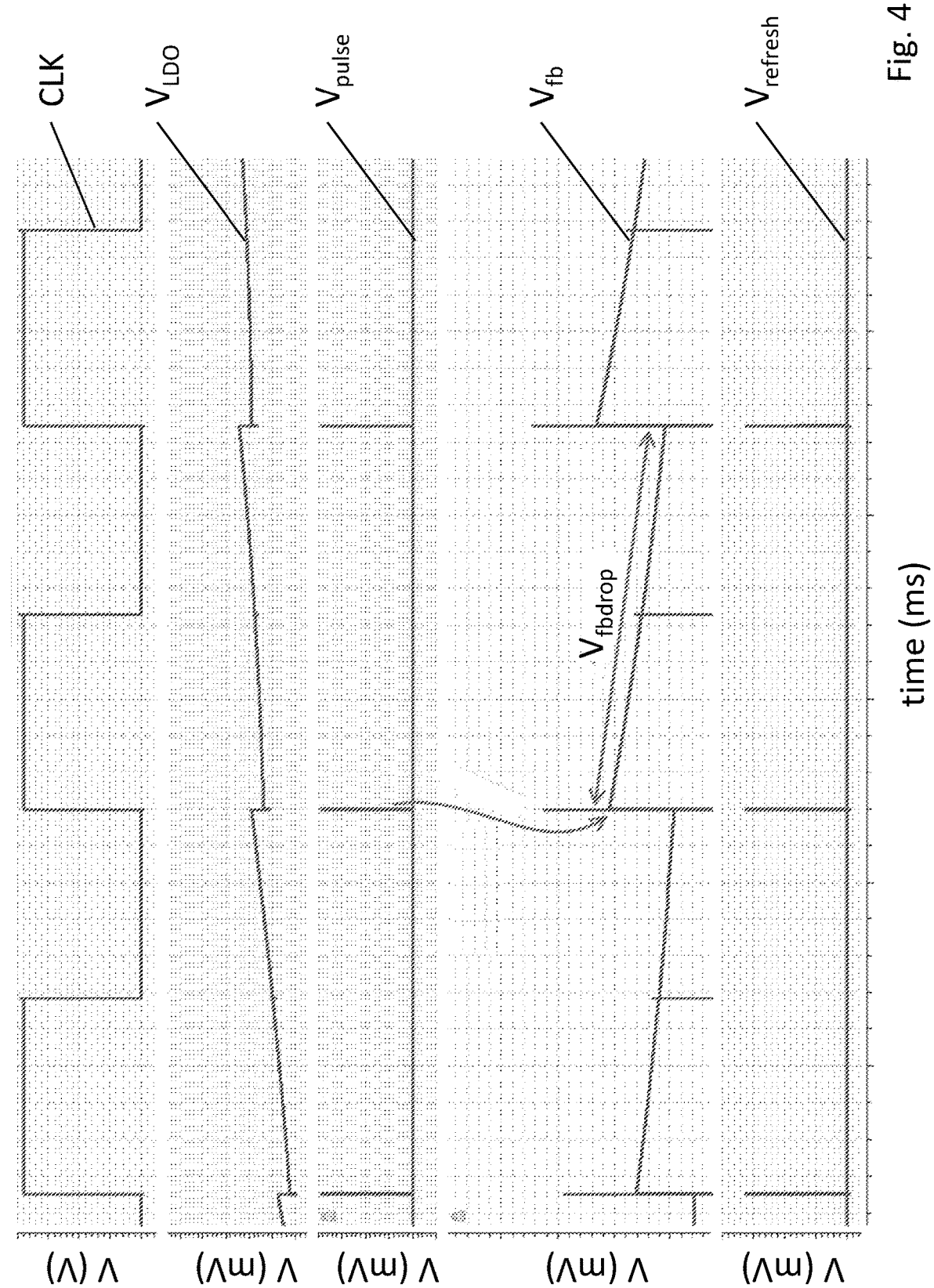
FIG. 4 is a graph showing the voltage produced by the low-dropout voltage regulator of FIG. 3.

FIG. 4 is a graph showing the voltage $V_{LDO}$ produced by the low-dropout voltage regulator 28 of FIG. 3. Due to the intermittent "refreshing" of the feedback voltage $V_{fb}$ (i.e. the voltage taken from the node between $C_1$ and $C_2$), the average current consumption of the LDO 28 is reduced compared to a conventional LDO voltage regulator that uses a resistive divider to derive its feedback voltage. Between refreshes, the feedback voltage $V_{fb}$ will "droop" over time due to leakage of the second switching nMOSFET 24. However, by refreshing the feedback voltage $V_{fb}$ at a sufficiently high frequency (as set by the frequency of the clock signal CLK produced by the oscillator 14), the amount of "drooping" $V_{fbdroop}$ of the feedback voltage $V_{fb}$ can be maintained below a desired amount.

Thus it will be appreciated by those skilled in the art that embodiments of the present invention described herein provide an improved voltage divider circuit arrangement that has a lower average current consumption than conventional voltage divider circuit arrangements known in the art. It will be appreciated by those skilled in the art that the embodiments described herein are merely exemplary and are not limiting on the scope of the invention.

The invention claimed is:
1. A voltage divider circuit arrangement comprising:
a resistive divider circuit portion comprising at least first and second resistors having first and second resistor impedance values respectively, wherein said first and second resistors are connected in series and are arranged to provide a refresh voltage at a refresh node therebetween;

a capacitive divider circuit portion comprising at least first and second capacitors having first and second capacitor impedance values respectively, wherein said first and second capacitors are connected in series and are arranged to provide an output voltage at an output node therebetween;

a switching circuit portion arranged intermittently to switch the voltage divider circuit arrangement between a first mode wherein the resistive divider circuit portion is enabled and the output node is connected to the refresh node, and a second mode wherein the resistive divider circuit portion is disabled and the output node is not connected to the refresh node; and a hysteresis circuit portion arranged to vary the refresh voltage and the output voltage between a first value and a second value;

wherein the hysteresis circuit portion comprises a hysteresis resistor and a hysteresis capacitor, wherein said the hysteresis circuit portion is arranged selectively to connect said hysteresis resistor in series with at least one of the first and second resistors and to connect said hysteresis capacitor in parallel with at least one of the first and second capacitors; and wherein the hysteresis circuit portion further comprises a first hysteresis transistor connected in parallel with the hysteresis resistor and a second hysteresis transistor connected in series with the hysteresis capacitor, wherein a first hysteresis signal is applied to the gate terminal of the first hysteresis transistor and a second hysteresis signal is applied to the gate terminal of the second hysteresis transistor.

2. The voltage divider circuit arrangement as claimed in claim 1, wherein a ratio between the first and second resistor impedance values is substantially equal to a ratio between the first and second capacitor impedance values and an input voltage connected across the resistive divider circuit portion is the same as an input voltage connected across the capacitive divider circuit portion.

3. The voltage divider circuit arrangement as claimed in claim 1, configured to provide a predetermined delay between the output node being disconnected from the refresh node and the resistive divider circuit portion being disabled when the switching circuit portion switches to the second mode.

4. The voltage divider circuit arrangement as claimed in claim 1, wherein the intermittent switching between the first mode and the second mode is periodic.

5. The voltage divider circuit arrangement as claimed in claim 1, wherein the switching circuit portion comprises an oscillator circuit portion arranged to produce a reference signal at a reference frequency and a one shot circuit portion arranged to produce the switch mode signal from the reference signal.

6. The voltage divider circuit arrangement as claimed in claim 1, wherein the first hysteresis transistor comprises a p-channel metal-oxide-semiconductor field-effect-transistor and the second hysteresis transistor comprises an n-channel metal-oxide-semiconductor field-effect-transistor.

7. The voltage divider circuit arrangement as claimed in claim 1, configured to provide a predetermined delay between the resistive divider circuit portion being enabled and the output node being connected to the refresh node when the switching circuit portion switches to the first mode.

8. The voltage divider circuit arrangement as claimed in claim 7, further comprising a delay circuit arranged to provide the predetermined delay between the resistive divider circuit portion being enabled and the output node being connected to the refresh node when the switching circuit portion switches to the first mode and/or a predetermined delay between the output node being disconnected from the refresh node and the resistive divider circuit portion being disabled when the switching circuit portion switches to the second mode.

9. The voltage divider circuit arrangement as claimed in claim 1, wherein the intermittent switching is controlled by a mode switch signal.

10. The voltage divider circuit arrangement as claimed in claim 9, wherein the switching circuit portion comprises a second switching transistor connected between the refresh node and the output node.

11. The voltage divider circuit arrangement as claimed in claim 9, wherein the mode switch signal comprises a series of pulses.

12. The voltage divider circuit arrangement as claimed in claim 9, wherein the switching circuit portion comprises a first switching transistor connected in series with the resistive divider circuit portion.

13. The voltage divider circuit arrangement as claimed in claim 12, wherein the first switching transistor comprises a p-channel metal-oxide-semiconductor field-effect-transistor arranged to receive at its gate terminal a logical negation of the mode switch signal.

14. The voltage divider circuit arrangement as claimed in claim 10, wherein the second switching transistor comprises an n-channel metal-oxide-semiconductor field-effect-transistor arranged to receive at its respective gate terminal the mode switch signal.

15. A voltage regulating circuit arrangement comprising:
an error amplifier arranged to compare a reference voltage to a feedback voltage and produce at its output an error voltage proportional to a difference between said reference and feedback voltages;

a pass field-effect-transistor arranged such that a source terminal thereof is connected to an input voltage, a gate terminal thereof connected to the output of the error amplifier, and a drain terminal thereof is connected to a load capacitor, wherein a regulator output voltage is produced at a node between the drain terminal of the pass field-effect-transistor and the load capacitor; and a voltage divider circuit arrangement comprising:
a resistive divider circuit portion comprising at least first and second resistors having first and second resistor impedance values respectively, wherein said first and second resistors are connected in series and are arranged to provide a refresh voltage at a refresh node therebetween;

a capacitive divider circuit portion comprising at least first and second capacitors having first and second capacitor impedance values respectively, wherein said first and second capacitors are connected in series and are arranged to provide the feedback voltage at an output node therebetween;

a switching circuit portion arranged intermittently to switch the voltage divider circuit arrangement between a first mode wherein the resistive divider circuit portion is enabled and the output node is connected to the refresh node, and a second mode wherein the resistive divider circuit portion is disabled and the output node is not connected to the refresh node; and a hysteresis circuit portion arranged to vary the refresh voltage and the output voltage between a first value and a second value wherein the hysteresis circuit portion comprises a hysteresis resistor and a hysteresis capacitor, wherein said the hysteresis circuit portion is arranged selectively to connect said hysteresis resistor in series with at least one of the first and second resistors and to connect said hysteresis capacitor in parallel with at least one of the first and second capacitors; and wherein the hysteresis circuit portion further comprises a first hysteresis transistor connected in parallel with the hysteresis resistor and a second hysteresis transistor connected in series with the hysteresis capacitor, wherein a first hysteresis signal is applied to the gate terminal of the first hysteresis transistor and a second hysteresis signal is applied to the gate terminal of the second hysteresis transistor.

16. The voltage regulating circuit as claimed in claim 15, wherein the first hysteresis transistor comprises a p-channel metal-oxide-semiconductor field-effect-transistor and the second hysteresis transistor comprises an n-channel metal-oxide-semiconductor field-effect-transistor.

* * * * *